United States Patent
Rudolph

(10) Patent No.: US 9,647,482 B2
(45) Date of Patent: May 9, 2017

(54) SMART WIRELESS CHARGER

(71) Applicant: NXP B.V., Eindhoven (NL)

(72) Inventor: Thomas Klaus Rudolph, Hamburg (DE)

(73) Assignee: NXP B.V., Eindhoven (NL)

(*) Notice: Subject to any disclaimer, the term of this patent is extended or adjusted under 35 U.S.C. 154(b) by 197 days.

(21) Appl. No.: 14/466,030

(22) Filed: Aug. 22, 2014

(65) Prior Publication Data

US 2016/0056658 A1    Feb. 25, 2016

(51) Int. Cl.
*H02J 7/00* (2006.01)
*H04B 5/00* (2006.01)
*H02J 5/00* (2016.01)
*G01R 29/08* (2006.01)
*H02J 7/02* (2016.01)

(52) U.S. Cl.
CPC .......... *H02J 7/025* (2013.01); *G01R 29/0814* (2013.01); *H02J 5/005* (2013.01); *H04B 5/0037* (2013.01); *H04B 5/0075* (2013.01)

(58) Field of Classification Search
CPC ...... H02J 7/025; H02J 5/005; G01R 29/0814; H04B 5/0037; H04B 5/0075
USPC ........................................ 320/107–108, 114
See application file for complete search history.

(56) References Cited

U.S. PATENT DOCUMENTS

| | | | |
|---|---|---|---|
| 6,943,666 B2* | 9/2005 | Mooney | H02J 7/0045 307/10.3 |
| 2012/0280574 A1 | 11/2012 | Hur et al. | |
| 2012/0299538 A1* | 11/2012 | Arai | B60L 11/182 320/108 |
| 2013/0110318 A1 | 5/2013 | Colja et al. | |
| 2013/0307474 A1* | 11/2013 | Shimura | H01M 10/46 320/108 |
| 2014/0009261 A1* | 1/2014 | Iwanaga | H02J 7/025 340/5.32 |
| 2014/0217816 A1 | 8/2014 | Okada | |
| 2016/0020632 A1* | 1/2016 | Lickfelt | H02J 7/025 320/108 |
| 2016/0111912 A1* | 4/2016 | Shimura | H01M 10/46 320/108 |

FOREIGN PATENT DOCUMENTS

| | | |
|---|---|---|
| JP | 2013-102642 A | 5/2013 |
| JP | 2013-126301 A | 6/2013 |
| KR | 10-2014-0082208 A | 7/2014 |

OTHER PUBLICATIONS

Extended European Search Report for Patent Appln. No. 15181365.6 (Dec. 3, 2015).

* cited by examiner

*Primary Examiner* — Stacy Whitmore
(74) *Attorney, Agent, or Firm* — Rajeev Madnawat

(57) ABSTRACT

A wireless charging system is disclosed. The wireless charging system includes a coil to create electromagnetic field and a sniffer system to detect a presence of a low frequency (LF) signal. The sniffer system is configured to deactivate the coil for a predetermined duration and perform an operation to detect the presence of the LF signal.

6 Claims, 2 Drawing Sheets

SMART WIRELESS CHARGER

BACKGROUND

Wireless chargers are typically used for charging consumer devices such as mobile phones, electric toothbrushes, shavers, etc. Wireless chargers offer various advantages such as no exposed electrical connections, safer and durable. Wireless chargers also help reduce clutters of wires.

Wireless chargers use inductive charging mechanisms. Inductive charging uses an electromagnetic field to transfer energy between a power source and a device to be charged. Electromagnetic energy is sent through an inductive coupling to the device, which can then use that energy to charge batteries to run the device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a wireless charging system is disclosed. The wireless charging system includes a coil to create electromagnetic field and a sniffer system to detect a presence of a low frequency (LF) signal. The coil is deactivated for a predetermined duration when the LF signal is detected.

In another embodiment, a method is disclosed. The method includes (a) deactivating a coil in a wireless charging system, (b) activating a low frequency (LF) detection system incorporated in the wireless charging system, and (c) performing an operation for detecting a LF signal. If the LF signal is detected, continue to keep the coil deactivated for a predetermined duration and if the LF signal is not detected, activating the coil. Steps (a) to (c) are repeated at regular predetermined intervals.

The sniffer system includes a LF sensing coil and a signal detector. The sniffer system is further configured to activate the LF sensing coil when the operation fails to detect the LF signal during the predetermined duration. The LF signal may be transmitted by a keyless entry system. The coil is configured to transmit electromagnetic energy to charge a battery of an external device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

After market solution for Wireless Power Charging (WLPC), that are brought into a vehicle that is equipped with a Keyless Entry system, are not designed to inhibit charging when a Keyless Entry communication is in progress. WLPC systems use a magnetic LF field with a frequency that is typically within the frequency band used by the Keyless Entry systems. Concurrent operations of the Keyless Entry system and the WLPC can cause LF communication interference between the vehicle control module and the key. Consequently the wireless charging operations are likely to interfere with the Keyless Entry systems, causing the key not being able to start or operate the vehicle/engine.

Figure 1:
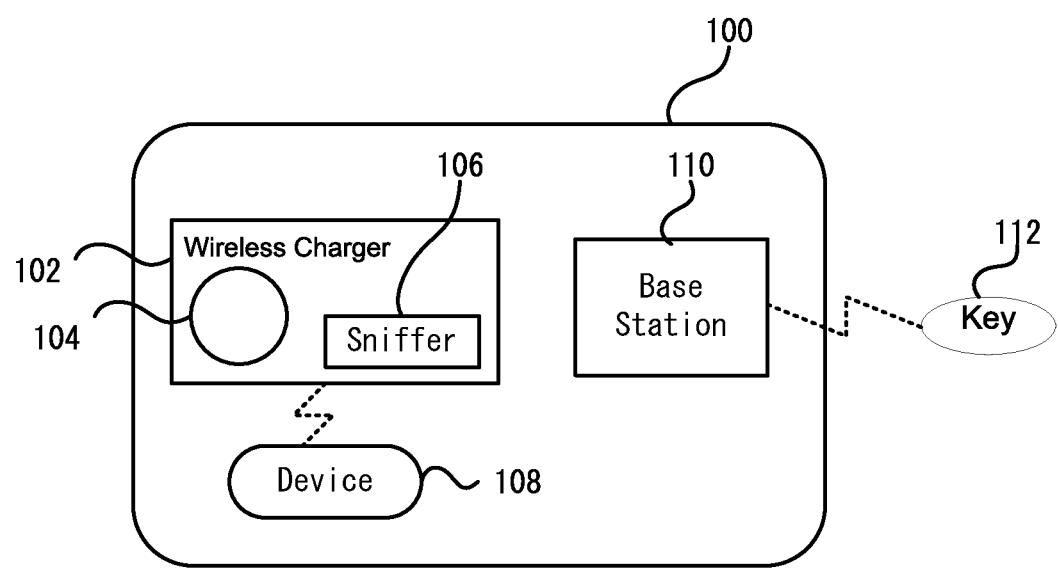
FIG. 1 is a schematic of a wireless charging and keyless entry system.

FIG. 1 illustrates a schematic of a vehicle 100 including a WLPC 102 and a Keyless Entry base station 110. A wireless key 112 is provided to communicate with the base station 110. The key 112 is typically used to securely operate functions of the vehicle 100. A device 108 is configured to be charged wirelessly through the WLPC 102. The WLPC 102 creates an electromagnetic field that is absorbed by the device 108. Energy is sent through an inductive coupling to the device 108, which can then use that energy to charge batteries or run the device 108.

The WLPC 102 typically uses an induction coil 104 to create an alternating electromagnetic field from within a charging base station, and a second induction coil (not shown) in the device 108 takes power from the electromagnetic field and converts it back into electrical current to charge the battery. The two induction coils in proximity combine to form an electrical transformer. Greater distances between sender and receiver coils can be achieved when the inductive charging system uses resonant inductive coupling.

When the battery of the device 108 is being charged using the WLPC 102, there is a continuous electromagnetic coupling between the WLPC 102 and the device 108. However, during this period of continuous electromagnetic coupling, if a user of the vehicle 100 attempts to perform an operation on the vehicle 100 through the key 112, the communication may fail because of the use of the same or overlapping frequency band for communication with the base station 110. In another example, the vehicle 100 may seek to interrogate the key 112 using LF telegram. This communication may fail because of the use of the same or overlapping frequency band for communication with the base station 110.

A sniffer system 106 is provided to detect a communication between the base station 110 and the key 112. The sniffer system 106 includes a low frequency (LF) sniffer coil and a signal detector. In one embodiment, the sniffer system 106 is activated at selected time intervals to detect LF communication. In another embodiment, the sniffer coil continuously hunts for LF signals. If signals are detected, the WLPC 102 is mutes its transmission for a predefined period of time and commences the charging operations after this predefined time interval. Of course, if the sniffer coil detects LF signals again, the same WLPC 102 muting cycle begins.

In one embodiment, prior to performing the detection, the WLPC 102 is turned off to stop transmittal of electromagnetic energy. If the sniffer system 104 detects a communication between the base station 110 and the key 112, the WLPC 102 stays deactivated. A configurable timer (not shown) may be employed to perform the cycle of deactivating the coil 104 and activating the sniffer system 106 at predetermined intervals. In other embodiments, the sniffer system 106 remains activated at all time and the sniffer coil continuously, as discussed in the previous paragraph.

Figure 2:
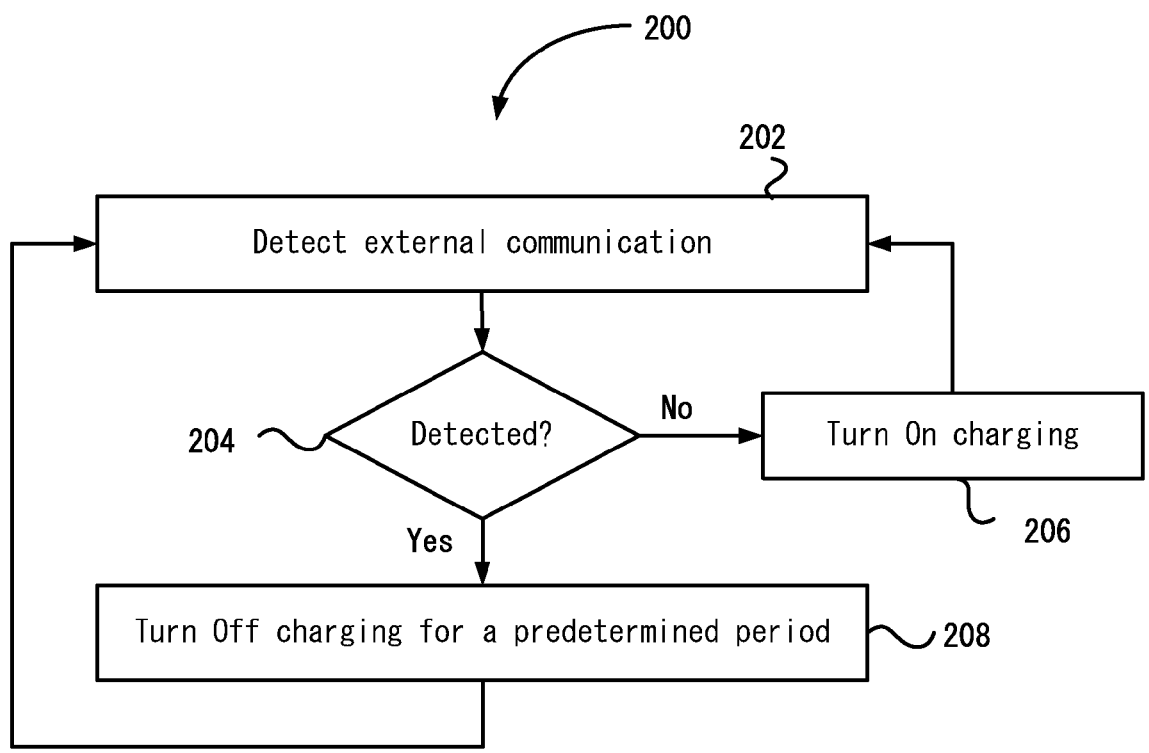
FIG. 2 illustrates an exemplary method for synchronizing wireless charger and keyless entry system operations.

FIG. 2 illustrates and exemplary method 200 of inhibiting the WLPC 102 operations during a communication between the base station 110 and the key 112. Accordingly, at step 202, the operations of WLPC 102 are shut off and the sniffer system 104 is set to detect any LF communication. At decision step 204, if a communication is detected, the WLPC 102 stays inhibited. If no communication is detected, at step 206, the operations of the WLPC 102 are resumed. The control then goes back to step 202 and after a predetermined time interval, the process, starting from step 202, is repeated.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A wireless charging system, comprising:
   an induction coil configured to create an electromagnetic field; and
   a sniffer system configured to detect communication by a low frequency (LF) signal at preselected intervals between a base station and a wireless key, deactivate the induction coil prior to performing the detection of communication by the LF signal, and continue to keep the induction coil deactivated for a predetermined duration after the sniffer system detected the communication by the LF signal between the base station and the key.

2. The wireless charging system of claim 1, wherein the sniffer system includes a LF sensing coil and a signal detector.

3. The wireless charging system of claim 1, wherein the LF signal is transmitted by a keyless entry system.

4. The wireless charging system of claim 1, wherein the induction coil is configured to transmit electromagnetic energy to charge a battery of an external device.

5. A method, comprising:
   (a) deactivating an induction coil in a wireless charging system;
   (b) activating a low frequency (LF) detection system incorporated in the wireless charging system; and
   (c) detecting, in the wireless charging system, communication by a LF signal between the base station and a wireless key, wherein, if the LF signal is detected, continuing to keep the induction coil deactivated for a predetermined duration and, if the LF signal is not detected, reactivating the induction coil.

6. The method of claim 5, further comprising:
   repeating steps (a) to (c) at regular predetermined intervals.

* * * * *